(12) United States Patent
Bárdos et al.

(10) Patent No.: US 6,899,054 B1
(45) Date of Patent: May 31, 2005

(54) DEVICE FOR HYBRID PLASMA PROCESSING

(76) Inventors: Ladislav Bárdos, Ulleråkersvägen 64, SE-756 43 Uppsala (SE); Hana Baránková, Ulleråkersvägen 64, SE-756 43 Uppsala (SE)

( * ) Notice: Subject to any disclaimer, the term of this patent is extended or adjusted under 35 U.S.C. 154(b) by 92 days.

(21) Appl. No.: 10/130,709

(22) PCT Filed: Nov. 23, 2000

(86) PCT No.: PCT/SE00/02315

§ 371 (c)(1),
(2), (4) Date: Sep. 27, 2002

(87) PCT Pub. No.: WO01/39560

PCT Pub. Date: May 31, 2001

(30) Foreign Application Priority Data

Nov. 26, 1999 (SE) .............................. 9904295

(51) Int. Cl.[7] .......................... C23C 16/00; H05H 1/00; C23F 1/00; H01L 21/00
(52) U.S. Cl. .......................... 118/723 MW; 118/723 E; 156/345.41; 156/345.43
(58) Field of Search ................................. 118/723 MW, 118/723 E, 723 MP, 723 MA; 156/345.41, 345.47, 345.43

(56) References Cited

U.S. PATENT DOCUMENTS 5,453,305 A * 9/1995 Lee .............................. 427/562
5,688,382 A * 11/1997 Besen et al. ............ 204/192.12
5,734,143 A * 3/1998 Kawase et al. ........ 219/121.43

FOREIGN PATENT DOCUMENTS

EP 0 727 508 A1 8/1996

OTHER PUBLICATIONS

Bardos et al., "New microwave and hollow cathode hybrid plasma sources", Surface and Coatings Technology 177–178 (2004), pp. 651–656.
Lejeune et al., "Rf multipolar plasma for broad and reactive ion beams", Pergamon Journals Ltd., vol. 36, Nos. 11–12, pp. 837–840.
Bardos et al., "High Rate Jet Plasma–Assisted Chemical Vapour Deposition", Thin Solid Films, 158 (1988), pp. 265–270.
Chris M. Horowitz, "Hollow cathode reactive sputter etching—A new high–rate process", Appl. Phys. Lett. 43(10), Nov. 15, 1983, pp. 977–979.
Von A. Guntherschlze, Zeitschrift fur technische Physik Nr. 2, 1930, pp. 49–54.
Young H. Lee et al., "Plasma Enhanced Chemical Vapor Deposition of $TiO_2$ in Microwave–Radio Frequency Hybrid Plasma Reactor," J. Vac. Sci. Technol., A 13(3), 1995, pp. 596–601.

* cited by examiner

Primary Examiner—Parviz Hassanzadeh
(74) Attorney, Agent, or Firm—Young & Thompson (57) ABSTRACT

A device for hybrid plasma processing, particularly for deposition of thin films and for plasma treatment of samples, in a plasma reactor with pumping system characterized in that at least one feeder of microwave power (2) is installed in the plasma reactor (1) and connected to a microwave generator (3) for generation of a microwave plasma (4) in contact with at least one hollow cathode (5) in the plasma reactor, where the hollow cathode is powered from a cathode power generator (6). At least one inlet for a processing gas (7) is installed behind the hollow cathode and the gas is admitted into the plasma reactor through the hollow cathode where a hollow cathode plasma (9) is generated. A magnetic element (10) is used for generation of a perpendicular magnetic field (11) and/or a longitudinal magnetic field (12) at an outlet (13) from the hollow cathode.

21 Claims, 6 Drawing Sheets

DEVICE FOR HYBRID PLASMA PROCESSING

TECHNICAL FIELD

The present invention relates to a device for hybrid plasma processing and, more particularly, for deposition of thin films and plasma treatment of surfaces of samples using a hybrid microwave and hollow cathode plasma.

BACKGROUND OF THE INVENTION

The plasma processes in microwave discharges are based on electrons, because heavy ions are not able to follow changes of the microwave field. The microwave plasma might be produced by: (i) anisotropic generation, and (ii) an anisotropic generation in a magnetic field. The isotropic generation represents simple absorption of the microwave energy in the plasma without any preferential directions defined by external forces. The isotropic plasma has an upper electron density limit, so called cutoff density, which depends linearly on the square of the generator frequency. The most common anisotropic generation is the Electron Cyclotron Resonance (ECR). There the microwave power is absorbed in the plasma in a magnetic field having induction $B=B_{ce}=2\pi m/e$, where f is the frequency of the generator (typically $2.4 \cdot 10^9$ $s^{-1}$), m and e are the electron mass ($9.1 \cdot 10^{-31}$ kg) and electron charge ($1.6 \cdot 10^9$ As), respectively. The value of the ECR field for typical microwave generators is $B_{ce}=8.57 \cdot 10^{-2}$ Tesla. In the anisotropic microwave plasmas the plasma electron density may even exceed the cutoff density. The plasma density in the microwave plasma is typically high ($\geq 1010$ $cm^{-3}$), particularly in low pressure ECR plasmas, but the energy of ions is often insufficient. Contrary to this, in a direct current (DC) generation, or at lower frequencies, for example at radio frequency (RF) generation (order of $10^6$–$10^7$ Hz) applied through an arbitrary RF electrode, the ions may follow the generating field and gain a sufficient energy. However, a high generation frequency in the microwave case (order of 109 Hz) can provide higher plasma density than any lower frequency generation at the same power, because of higher cutoff density allowed. Therefore an additional DC or RF bias applied to sample holders or auxiliary electrodes is often necessary to increase ion energy in the microwave systems. The efficiency of the microwave generation is very sensitive to the geometry of the launching system. The conventional electrode less generation of the microwave plasma doesn't need metal electrodes that may cause metal contamination. But such systems often require additional electrodes for ion energy control, anyway. Moreover, because of a possibility of coating dielectric windows at microwave inlets by absorbing films, the windows require special arrangement with protecting film depositions in a technology using PE CVD (Plasma Enhanced Chemical Vapor Deposition).

The microwave devices of different constructions have been used for different surface treatments (see for instance M. Moisan and J. Pelletier, eds.: "Microwave Excited Plasmas", Elsevier, Amsterdam, 1992). During last decade the microwave plasma is frequently used for deposition of carbonaceous films, like diamond or carbon nitrides. In U.S. Pat. No. 4,898,118 the generation of the microwave plasma is fulfilled in a reaction vessel disposed to penetrate through the rectangular wave-guide. In U.S. Pat. No. 4,940,015 the reactor for diamond film synthesis is based on a tunable evacuated microwave cavity adjacent to the rectangular wave-guide. The coupling of the microwave power is fulfilled by an antenna inside the wave-guide and outside the low pressure region directing the microwave power into the cavity through the dielectric window positioned in a bottom side of a particularly designed cylindrical part of the cavity. In U.S. Pat. No. 4,958,590 the generation of the microwave plasma is fulfilled inside a reaction tube of particular design located inside a wave-guide of specified length. The plasma is generated in a travelling wave mode. A device with ECR microwave plasma is claimed in U.S. Pat. No. 4,915,979. In this patent the dimensions of reaction chamber are optimized with respect to Larmor radii of electrons, so that the spatial uniformity of the plasma electron density can be improved. In a Swedish Patent Application 9302222-6 a unique system was described for the isotropic microwave plasma generation. The system is based on a plasma slab generated by surface waves and used as an antenna for a subsequent generation of a bulk microwave plasma in resonator. An additional electrode in this system allows control of both the current to the substrate and coupling of the plasma antenna with the resonator (see e.g., Bárdos et al, J. Vac. Sci. Technol., 1995). A simple electrode generation of the microwave plasma has been recently reported for PE CVD of C—N films (Bardos et al, Proc. SVC Tech. Con. 1999). The system combines efficient low power generation with a possibility of restriction of the plasma zone at the processed surface and easy application of auxiliary fields. In the described present art the electrodes in the microwave plasma were used only either as microwave launching antennas or as auxiliary applicators for additional electric fields. Additional fields in microwave plasma may be used for generation of independent plasma or plasma dependent on pre-ionization from the original microwave plasma. These combinations may lead to more suitable advanced processing plasma, denoted usually as a "dual plasma" or "hybrid plasma". Example of a hybrid plasma generated in an anisotropic (magnetized) microwave plasma combined with DC and AC fields applied by a set of electrodes is claimed in Japanese patent No. 01191779 A by F. Kanji (1988). A typical example of dual plasma generated in an isotropic microwave plasma is claimed in U.S. Pat. No. 4,691,662 by T. A. Roppel et al. (1986). Here a disk microwave plasma acts as a source of excited ion and free radical species and electrons for the second plasma which is hybrid in that it contains species from both microwave and DC (or RF depending bias) excitation through metal plate means. The system may work also with an anisotropic plasma in the ECR mode.

Contrary to "soft" microwave plasmas for chemistry-based treatments, for instance plasma etching or PE CVD, the Physical Vapor Deposition (PVD) of films requires presence of a solid target (usually cathode) and either high ion energies (for sputtering) or large electron (or ion) current for heating (evaporation) of the target. Very efficient "electrode-based" discharges for surface treatment are generated by hollow cathodes. The cathode is connected to a negative pole of a DC generator and the positive pole is connected to a suitable counter anode. Depending on the DC power the hollow cathode discharge can be excited in a glow regime or in an arc regime. The principle of the hollow cathode discharge is based on its suitable geometry, where an electron emitted from one cathode wall interacts with an equivalent electric field with opposite orientation at the opposite wall. Thus the electrons may oscillate between inner walls of the hollow cathode and substantially enhance the ionization of the present gas, or metal deliberated from the cathode wall. Since 1983 the hollow cathode glow discharges have been generated also by alternating currents (AC). Typical frequency of AC generators for this purpose is between $10^5$ s$^{-1}$ and $10^8$ s$^{-1}$. The anode in the RF generated hollow cathodes is the RF plasma itself (a virtual anode), in contact with the real counter electrode connected to the RF generator (Bardos et al., J. Non Cryst. Solids 97/98, 281 (1987)). Effects of additional magnetic fields have been found in hollow cathodes, see e.g. review by K. H. Schoenbach, invited paper at ICPIG 21, Bochum 1993, Proc. III, pp. 287–296. A focused magnetic field was used in an apparatus for generation of a linear arc discharge for plasma processing (LAD) by Bardos et al. in a Swedish Patent Application 9403988-0 (U.S. Pat. No. 5,908,602). In this apparatus a pair of electrode plates placed opposite to each other forms parallel-plate hollow cathode, negative with respect to the surrounding plasma. The magnetic field perpendicular to the cathode plates and located close to the cathode outlet facilitates the hollow cathode discharge between the plates in the outlet slit. The hot zones are formed at both plates along the outlet slit due to an enhanced ion bombardment of the plate surfaces. The magnetic field geometry in the LAD system is stationary in both time and space. In the Swedish Patent Application 9704260-0 by Barankova et al. a plasma processing apparatus with rotary magnets for obtaining an adjustable time variable magnetic field has been claimed. The rotary permanent magnet systems, comprising individual permanent magnets with maximum magnetic induction more than $10^{-1}$ Tesla, may be installed along the outlet slit of the linear hollow cathode for better control of the hollow cathode discharge.

Because of high production of electrons even in glow regimes the hollow cathodes have been used since 1971 as both an electron source and the working gas ionization source in plasma processing devices for plasma assisted evaporation. The hollow cathode may enhance sputtering rate of magnetrons when used as an auxiliary source of electrons close to the target erosion zone (U.S. Pat. No. 4,588,490 1986 by J. J. Cuomo et al.). An another suitable application of the hollow cathode is its combination with an arc evaporator (see A. Lunk, Vacuum, 1990). These applications might be considered as an example of hollow cathode assisted hybrid plasma. However, no devices utilizing both the hollow cathode discharge and the microwave plasma simultaneously in a suitable hybrid system have been described yet. There are also no works or results yet reporting about combinations of the magnetized hollow cathodes with other plasma systems.

SUMMARY OF THE INVENTION

An object of the present invention is therefore to overcome the above described prior art discoveries and drawbacks and to provide an improved device for hybrid plasma processing, particularly for deposition of thin films and plasma treatment of surfaces of samples.

A device according to the present invention is set forth by the independent claim 1 and different embodiments of the invention are set forth by the dependent claims 2 to 9.

BRIEF DESCRIPTION OF THE DRAWINGS

The objects, features and advantages of the present invention as mention ed above may best be understood by making reference to the following description taken together with the accompanying drawings, wherein same reference numerals are used throughout the description indicating same or corresponding elements, and in which.

DETAILED DESCRIPTION

Figure 1:
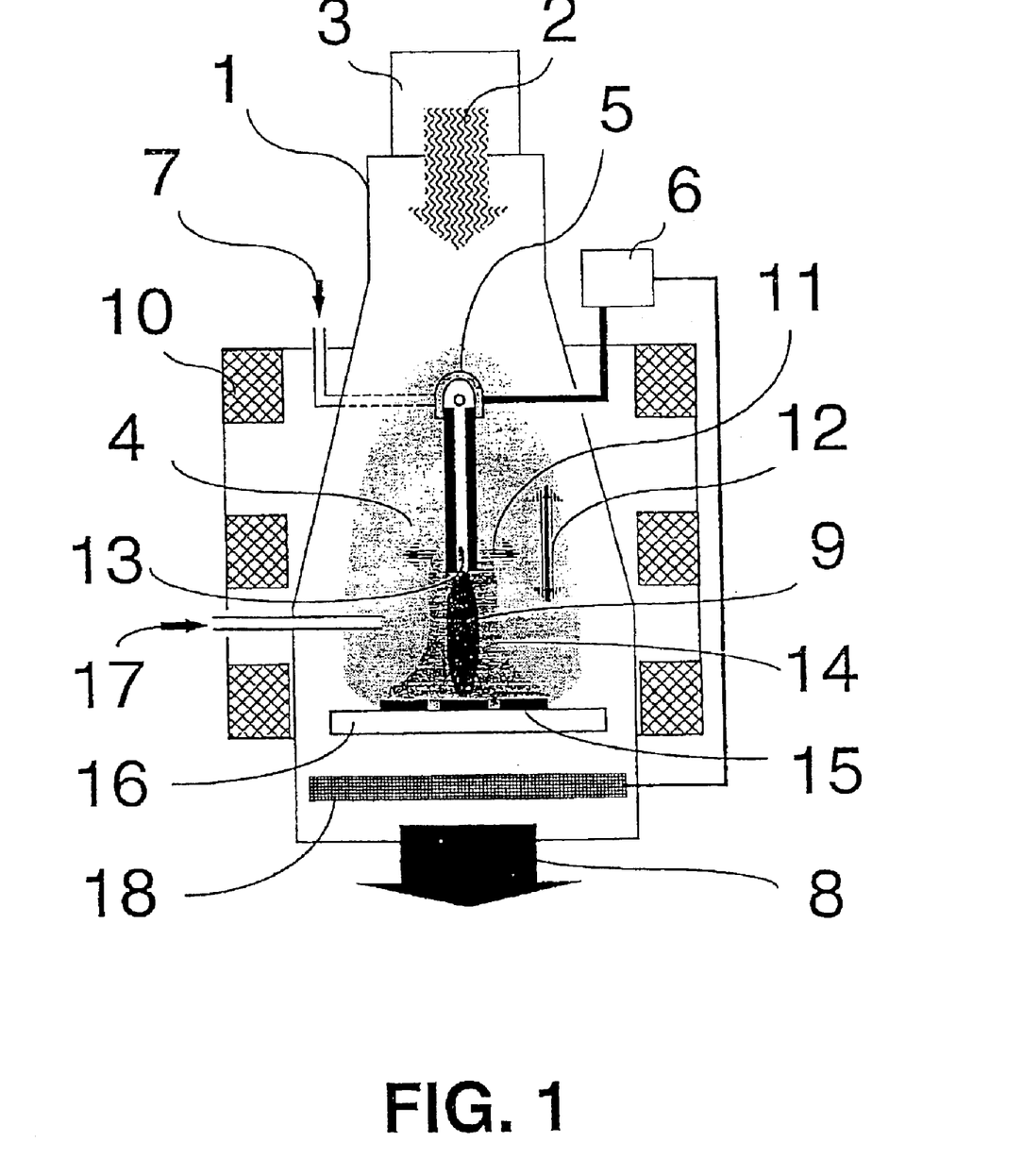
FIG. 1 is a schematic plan view of the device for hybrid plasma processing, particularly for deposition of thin films or plasma treatment of surfaces of samples in a hybrid microwave and hollow cathode plasma in a first embodiment according to the present invention.

Referring to FIG. 1 of the drawings, the first embodiment of the device for hybrid plasma processing according to the present invention will be described. At least one feeder of the microwave power 2 connected to a microwave generator 3 is installed in the plasma reactor 1 to generate a microwave plasma 4 in contact with at least one hollow cathode 5 in this plasma reactor. The hollow cathode is powered from a cathode power generator 6 and comprises at least one inlet for a processing gas 7, installed behind the hollow cathode. The cathode power generator may be either DC or AC. The processing gas is admitted into the plasma reactor through the hollow cathode, where the hollow cathode plasma 9 is generated. The plasma reactor is equipped by a pumping system 8 for pumping gases from the plasma reactor and keeping the gas pressure at desired value in case of subatmospheric operation of the system. In case of atmospheric pressure operation of the device the pumping system has an auxiliary function e.g., for pumping of residual gases after individual operating cycles. A magnetic means 10 is provided for generation of a perpendicular magnetic field 11 and/or a longitudinal magnetic field 12 with respect to the axis of the hollow cathode at its outlet 13. The magnetic field may have several effects, depending on both its geometry and its induction. It may act as a simple magnetic confinement of the plasma around the outlet 13 of the hollow cathode. It may also enable a resonant absorption of the microwave power and generation of the ECR microwave plasma, if the field induction is $B \geq B_{ce}$. And, moreover the magnetic field may be used for enhancement of the hollow cathode effect in the outlet of the hollow cathode and generation of the hollow cathode plasma. Simultaneous generation of the microwave plasma and the hollow cathode plasma helps in pre-ionization and sustenance of both individual plasmas and forms hybrid plasma 14. This hybrid plasma consisting of the microwave plasma 4 and the hollow cathode plasma 9 is used for processing of samples 15 placed on a sample holder 16 in contact with this hybrid plasma. A further inlet of additional processing gas 17 is installed in the plasma reactor outside the hollow cathode. A counter electrode 18 connected to the cathode power generator serves as an auxiliary anode in the hollow cathode plasma circuit. The counter electrode may be represented by conductive walls of the plasma reactor and/or by the sample holder with samples.

EXAMPLES

Figure 2:
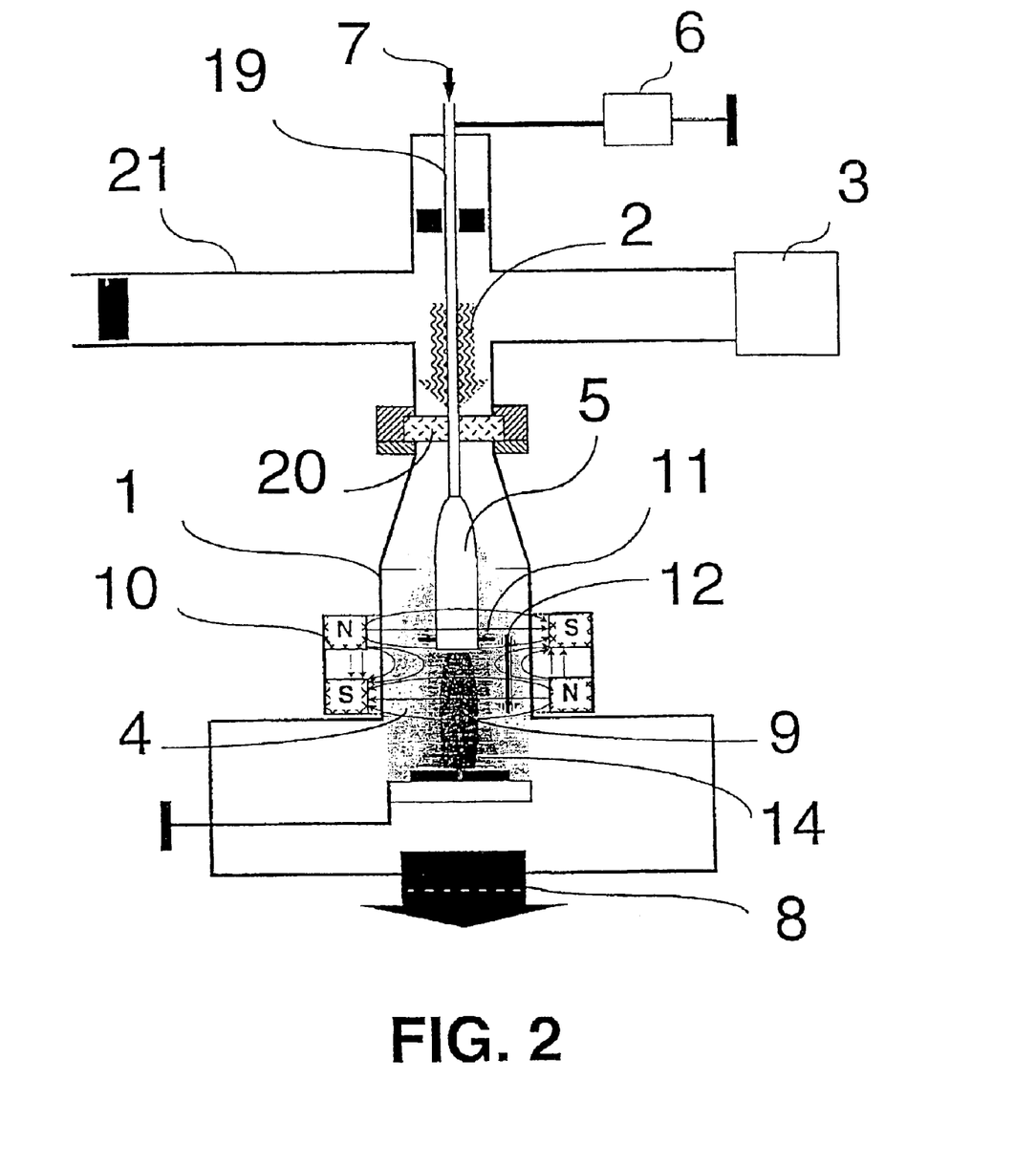
FIG. 2 is a schematic plan view of an EXAMPLE 1 of the device for hybrid plasma processing in a second embodiment of the present invention, in which a microwave antenna is installed into the plasma reactor through a dielectric window as a part of the hollow cathode.

Five examples of embodiments the microwave apparatus for plasma processing according to the present invention are described below:

Example 1 of FIG. 2 describes an embodiment of the device for hybrid plasma processing referred in FIG. 1, wherein feeding of the microwave power into the plasma reactor is accomplished by a microwave antenna 19 coupled to a feeding wave-guide 21 and installed in the plasma reactor through a dielectric window 20. The microwave antenna represents part of the hollow cathode coupled to the cathode power generator 6. The antenna may also serve as an inlet of the processing gas 7. The hollow cathode may be of deliberate shape, for instance a simple tube continuation of the antenna, or parallel plates installed at the antenna in the reactor. An advantage of this arrangement is for instance possibility to move the antenna—hollow cathode in the reactor, or possibility to apply an additional bias to the hollow cathode, superimposed to the cathode power generator.

Figure 3:
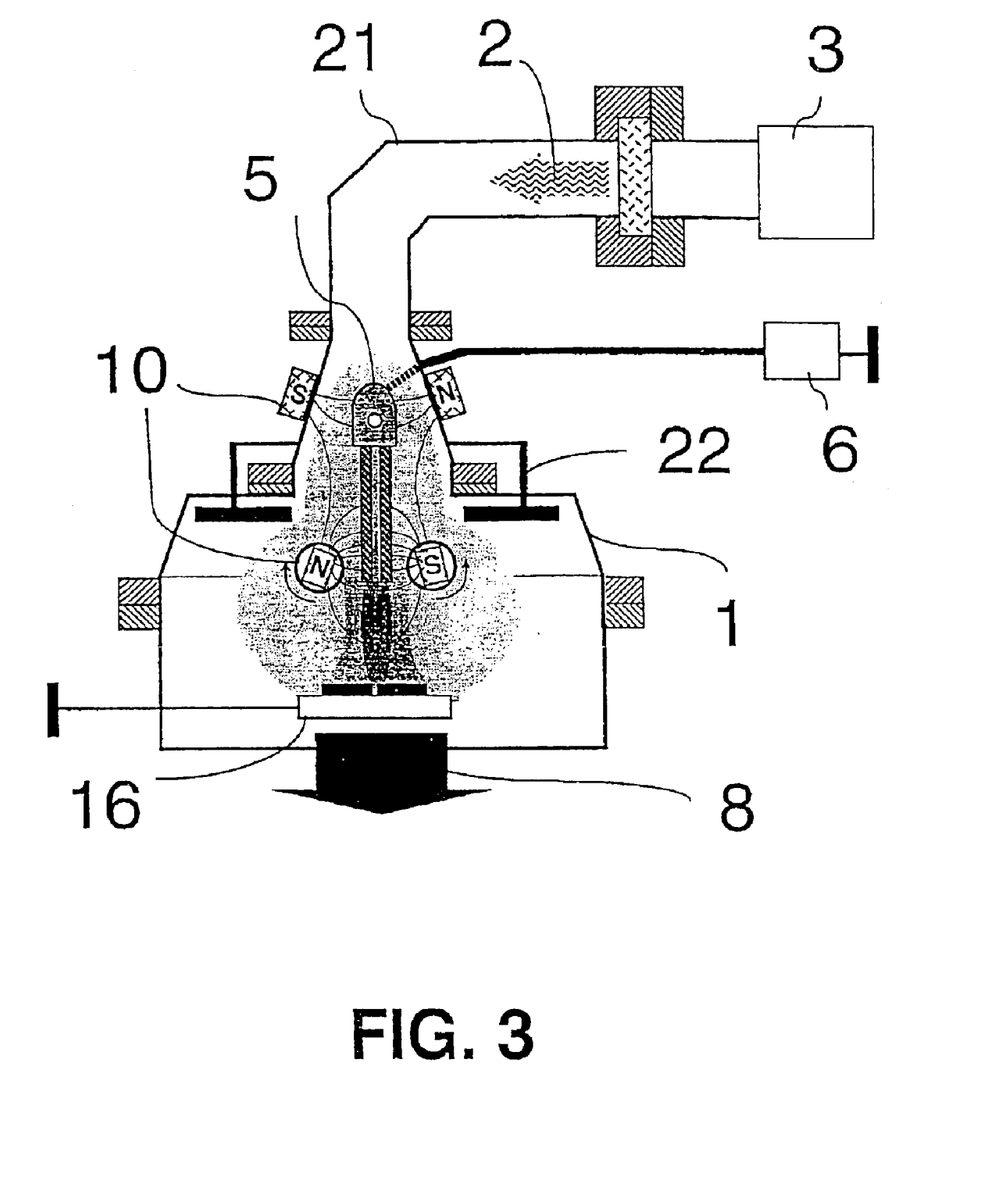
FIG. 3 is a schematic plan view of an EXAMPLE 2 of the device for hybrid plasma processing in a third embodiment of the present invention, in which the plasma reactor equipped by a tuning element forms a microwave resonant cavity with respect to the frequency of the microwave generator and the magnetic induction of the magnetic means is variable in time and/or in space.

Example 2 of FIG. 3 describes an embodiment of the device for hybrid plasma processing, wherein the plasma reactor 1 is equipped by a tuning element 22 and forms a microwave resonant cavity with respect to the frequency of the microwave generator. Advantage of this arrangement is possibility to enhance absorption of the microwave power and generation of the microwave plasma in the reactor where the hollow cathode is installed. Another option of the device according to the present invention and shown in this example is possibility to arrange the magnetic induction of the magnetic means 10 variable in time and/or in space. This may be arranged by spinning or vibrating magnets, by electromagnetic coils powered by an AC generator, etc.

Figure 4:
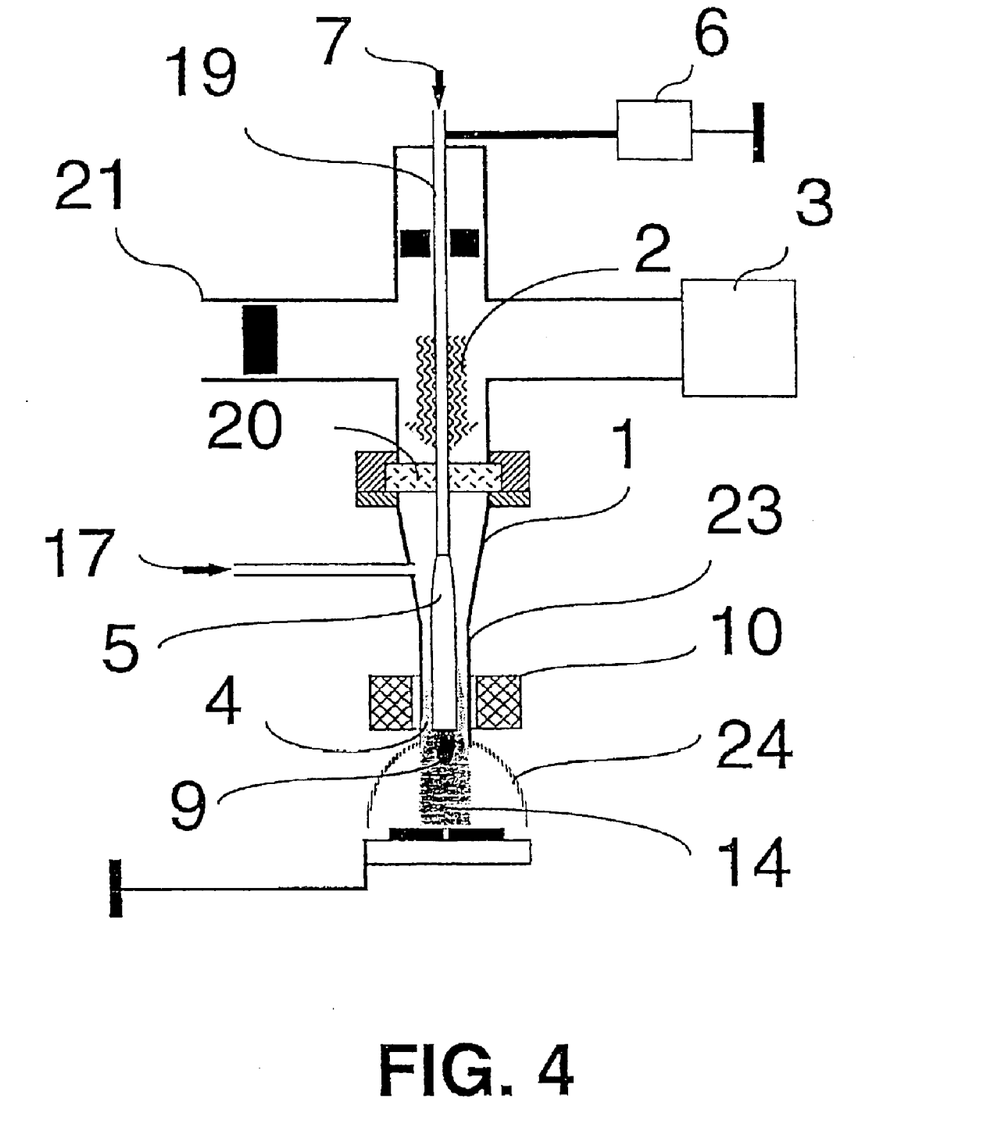
FIG. 4 is a schematic plan view of an EXAMPLE 3 of the device for hybrid plasma processing in a fourth embodiment of the present invention, in which the plasma reactor is opened to an ambient gas and its outlet has form of coaxial wave-guide with central conductor represented by the hollow cathode.

Example 3 of FIG. 4 describes an embodiment of the device for hybrid plasma processing, wherein the plasma reactor 1 has at least one outlet opened to an ambient gas and this outlet has form of a coaxial wave-guide 23 with a central conductor represented by the hollow cathode 5. For high pressure regimes the hollow cathode should have a small distance between the opposite inner walls, typically less than 1 mm. The hybrid plasma 14 is generated in contact with the samples 15. In cases of atmospheric or higher pressures during operation of the device the ambient gas, for instance air, might have an undesirable effect either on the hybrid plasma or on the processing regimes at the samples. For this reason the device may be equipped with a shielding 24 for reducing interaction of the hybrid plasma with an ambient gas.

Figure 5:
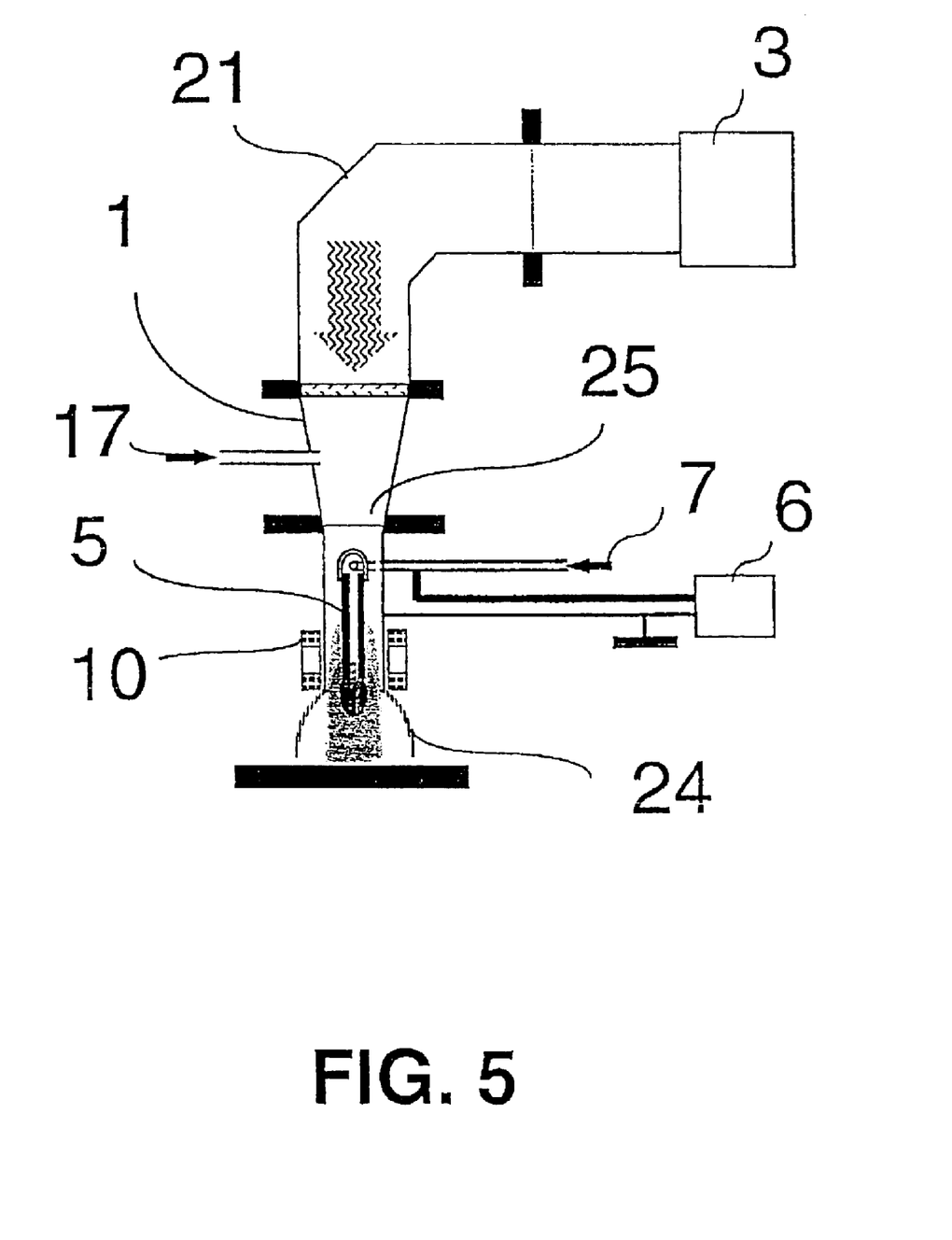
FIG. 5 is a schematic plan view of an EXAMPLE 4 of the device for hybrid plasma processing in a fifth embodiment of the present invention, in which the plasma reactor has an outlet opened to an ambient gas and the outlet has a form of tapered wave-guide in which a hollow cathode is installed.

Example 4 of FIG. 5 describes an embodiment of the device for hybrid plasma processing, wherein the plasma reactor 1 has at least one outlet opened to an ambient gas. This outlet has form of a tapered wave-guide 25 in which at least one hollow cathode 5 is installed. In this embodiment of the device the hollow cathode is installed without electrical contact with the wave-guide 1 and the wave-guide serves as a counter electrode for the hollow cathode. In a simple case of rectangular tapered wave-guide and a linear hollow cathode the magnetic means may be accomplished for instance by opposite permanent magnets or electromagnetic coils. The outlet of the reactor 1 may have circular or elliptic form and the suitable form of the hollow cathode may be circular or elliptic, but also rectangular or composed from an array of multiple hollow cathodes.

Figure 6:
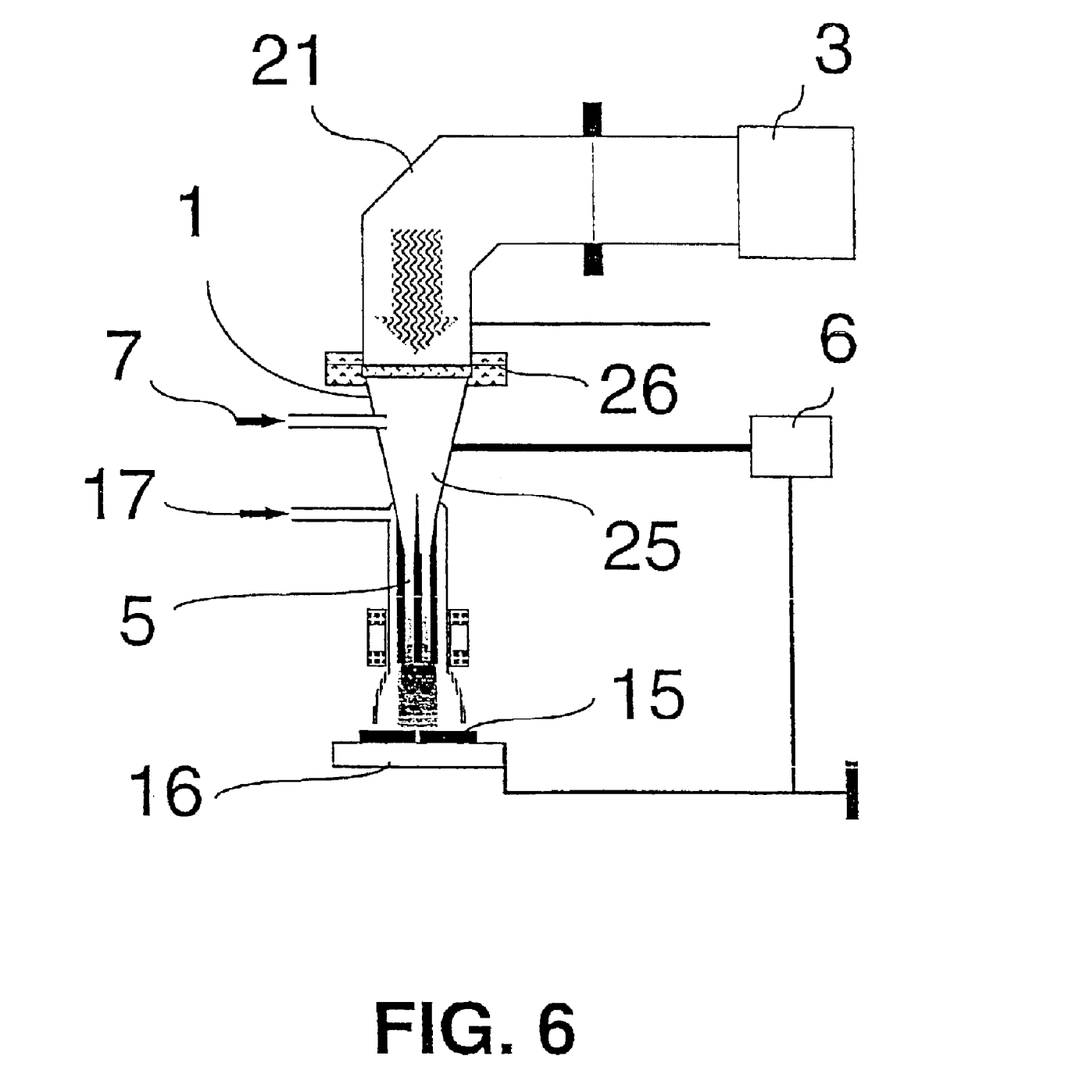
FIG. 6 is a schematic plan view of an EXAMPLE 5 of the device for hybrid plasma processing in a sixth embodiment of the present invention, in which the plasma reactor is electrically insulated from the feeding wave-guide and its outlet has form of a tapered rectangular wave-guide representing double hollow cathode.

Example 5 of FIG. 6 describes an embodiment of the device for hybrid plasma processing, wherein the plasma reactor 1 is electrically insulated from the feeding wave-guide 21 by an insulator 26. The plasma reactor has at least one outlet opened to an ambient gas and this outlet has form of the tapered rectangular wave-guide, in which at least one hollow cathode is integrated in a way that the tapered wave-guide is a part of at least one hollow cathode 5. In this case the plasma reactor has a double function. It represents a wave-guide with a tapered outlet and a hollow cathode or system of hollow cathodes, for instance a multi-slit cathode, integrated in this outlet. The reactor is connected to the cathode power generator for excitation of the hollow cathode plasma and the microwave power delivered into the reactor may excite the microwave plasma behind or inside the hollow cathode part. The reactor is provided by inlet of the processing gas 7, which might be combined with an inlet of the additional processing gas 17, or the inlet of the additional processing gas is positioned at the outlet of the reactor.

The device for hybrid plasma processing according to the present invention has an advantage particularly in applications, where either very low or very high gas pressure (including atmospheric and higher pressure) regimes are desirable with controllable parameters at high plasma density. In both cases the microwave plasma might be main source of pre-ionization for the hollow cathode. Very low pressure regimes (below 1 mTorr) may be favorably performed in magnetic fields of induction $B \geq B_{ce}$.

The device for hybrid plasma processing according to the invention can be utilized not only for the deposition of films, but also for other kinds of plasma processing, e.g. dry etching, plasma cleaning, oxidizing, plasma nitridization, etc.

The combination of the microwave plasma with the hollow cathode plasma according to the invention enables an independent control of the electron based microwave dissociation and radical activation of the active gas with an ionization and ion energy control through the hollow cathode. This also brings about a unique possibility to combine the hollow cathode PVD in an arc regime with the microwave plasma CVD for deposition of composite films.

A device for hybrid plasma processing according to this invention has been described with reference to its preferred embodiments. It is therefore to be understood that numerous changes and variations will be possible thereof without departing from the spirit and scope of the invention as defined by the attached claims.

What is claimed is:

1. A device for hybrid plasma processing comprising:
   a plasma reactor;
   at least one hollow cathode in the plasma reactor and a hollow cathode power generator, the hollow cathode having an outlet;
   a microwave plasma generator installed in the plasma reactor, the microwave plasma generator comprising at least one microwave power feeder and a microwave generator connected to the microwave power feeder;

at least one first processing gas inlet into the at least one hollow cathode;

a magnetic field generator constructed and arranged so as to be able to generate a magnetic field at the outlet of the hollow cathode in the plasma reactor, the magnetic field having an orientation that is at least one of perpendicular and longitudinal with reference to a longitudinal axis of the hollow cathode;

a second processing gas inlet having an outlet inside the reactor and outside the hollow cathode; and a counter electrode connected to the hollow cathode power generator;

wherein the hollow cathode is specifically constructed and arranged to have a geometry such that, when powered by the hollow cathode power generator to produce a hollow cathode plasma, the hollow cathode demonstrates the hollow cathode effect, in which an electron emitted from one wall of the hollow cathode interacts with an equivalent electric field with opposite orientation at an opposite wall; and wherein the microwave power feeder and the hollow cathode are positioned with respect to one another such that when the microwave power feeder generates a microwave plasma, the microwave plasma is in contact with the outlet of the at least one hollow cathode, and wherein the microwave plasma and the hollow cathode plasma combine to produce a hybrid plasma.

2. The device of claim 1, wherein the plasma reactor comprises a conductive wall, and wherein the conductive wall is connected to the hollow cathode power generator as the counter electrode.

3. The device according to claim 2, wherein the microwave power feeder comprises a microwave antenna coupled to a microwave wave-guide, the microwave antenna being installed in the plasma reactor through a dielectric window, the microwave antenna being constructed as the at least one processing gas inlet to the hollow cathode, the microwave antenna being arranged so as to connect the hollow cathode with the hollow cathode power generator.

4. The device according to 1, wherein the plasma reactor comprises a support for an object to be positioned within the hybrid plasma and wherein the support is connected to the hollow cathode power generator as the counter electrode.

5. The device according to claim 1, wherein the microwave power feeder comprises a microwave antenna coupled to a microwave wave-guide, the microwave antenna being installed in the plasma reactor through a dielectric window, the microwave antenna being constructed as a part of the hollow cathode so as to serve as the at least one first processing gas inlet to the hollow cathode, the microwave antenna being arranged so as to connect the hollow cathode with the hollow cathode power generator.

6. The device according to claim 5, wherein magnetic induction of the magnetic field generator is variable in at least one of time and space.

7. The device according to claims 6, wherein the microwave power feeder comprises at least one outlet opened to an ambient gas in the form of a coaxial microwave wave-guide having as a central conductor the hollow cathode; and wherein the plasma reactor further comprises:

a support for an object to be positioned within the hybrid plasma, wherein the support is connected to the hollow cathode power generator as the counter electrode; and a shielding arranged between the support and the outlet of the hollow cathode.

8. The device according to claims 6, wherein the microwave power feeder comprises at least one outlet opened to an ambient gas in the form of a tapered wave-guide in which the at least one hollow cathode is installed.

9. The device according to claim 5, wherein the microwave power feeder comprises at least one outlet opened to an ambient gas in the form of a coaxial microwave wave-guide having as a central conductor the hollow cathode; and wherein the plasma reactor further comprises:

a support for an object to be positioned within the hybrid plasma, wherein the support is connected to the hollow cathode power generator as the counter electrode; and a shielding arranged between the support and the outlet of the hollow cathode.

10. The device according to claim 5, wherein the microwave power feeder comprises at least one outlet opened to an ambient gas in the form of a tapered wave-guide in which said at least one hollow cathode is installed.

11. The device according to claim 10, wherein the hollow cathode is electrically insulated from the microwave power feeding wave-guide by an insulator, the outlet having a form of a tapered rectangular wave-guide in which said at least one hollow cathode is disposed, said tapered wave-guide being connected to the hollow cathode power generator as the counter electrode.

12. The device according to claim 10, wherein the hollow cathode is electrically insulated from the microwave power feeding wave-guide by an insulator, the tapered wave-guide being connected to the hollow cathode power generator as the counter electrode.

13. The device according to claim 5, wherein the plasma reactor is constructed as a microwave resonant cavity with respect to a frequency of the microwave generator, the plasma reactor being equipped with a tuning element for tuning a resonant absorption of power from the microwave generator.

14. The device according to claim 1, wherein the plasma reactor is constructed and arranged so as to operate as a microwave resonant cavity with respect to a frequency of the microwave generator, the plasma reactor further comprising a tuning element constructed so as to allow tuning a resonant absorption of power from the microwave generator.

15. The device according to claim 14, wherein magnetic induction of the magnetic field at the outlet of the hollow cathode reaches at least electron cyclotron resonance value $B_{ce}$ with respect to the frequency of the microwave generator.

16. The device according to claim 1, wherein magnetic inductance of the magnetic field at the outlet of the hollow cathode reaches at least electron cyclotron resonance value $B_{ce}$ with respect to the frequency of the microwave generator.

17. The device according to claim 16, wherein magnetic induction of the magnetic field generator is variable in at least one of time and in space.

18. The device according to claims 16, wherein the microwave power feeder comprises at least one outlet opened to an ambient gas in the form of a coaxial microwave wave-guide having as a central conductor the hollow cathode; and wherein the plasma reactor further comprises:

a support for an object to be positioned within the hybrid plasma, wherein the support is connected to the hollow cathode power generator as the counter electrode; and a shielding arranged between the support and the outlet of the hollow cathode.

19. The device according to claims 16, wherein the microwave power feeder comprises at least one outlet opened to an ambient gas in the form of a tapered waveguide in which the at least one hollow cathode is installed.

20. A device for hybrid plasma processing in a plasma reactor including a pumping system, the device comprising:

a plasma reactor;

means for generating a microwave plasma in the plasma reactor;

means for generating a hollow cathode plasma in the plasma reactor, the means for generating the hollow cathode plasma comprising opposing walls, wherein the hollow cathode plasma is one in which an electron emitted from one of the opposing walls interacts with an equivalent electric field with opposite orientation at another of the opposing walls;

means for introducing at least one first processing gas into the means for generating a hollow cathode plasma;

means for generating at least one of a perpendicular and a longitudinal magnetic field at the hollow cathode plasma;

means for introducing a second processing gas inside the reactor and outside the hollow cathode generating means; and a counter electrode connected to the hollow cathode generating means;

wherein the microwave plasma generating means and the hollow cathode generating means are positioned with respect to one another such that the microwave plasma and the hollow cathode plasma combine to produce a hybrid plasma.

21. A device for hybrid plasma processing in a plasma reactor including a pumping system, the device comprising:

a plasma reactor;

a microwave generator and a microwave generator power source connected to the plasma reactor;

means for generating a hollow cathode plasma in the plasma reactor, the means for generating the hollow cathode plasma comprising opposing walls, wherein the hollow cathode plasma is one in which an electron emitted from one of the opposing walls interacts with an equivalent electric field with opposite orientation at another of the opposing walls;

at least one first processing gas inlet into the hollow cathode generating means;

a magnetic field generator constructed and arranged so as to be able to generate at least one of a perpendicular and a longitudinal magnetic field at the hollow cathode plasma generating means;

a second processing gas inlet having an outlet inside the reactor and outside the hollow cathode; and a counter electrode connected to the hollow cathode generating means;

wherein the microwave generator and the hollow cathode generating means are positioned with respect to one another such that when the microwave generator is powered by the microwave generator power source, the microwave generator produces a microwave plasma that is in contact with the hollow cathode plasma, and wherein the microwave plasma and the hollow cathode plasma combine to produce a hybrid plasma.

* * * * *